United States Patent
Avneri et al.

(10) Patent No.: US 6,257,564 B1
(45) Date of Patent: Jul. 10, 2001

(54) VACUUM CHUCK HAVING VACUUM-NIPPLES WAFER SUPPORT

(75) Inventors: Israel Avneri, Ramat Gan; Eyal Duzi, Nes-Ziona; Dvir Keren, Tel Aviv; Avner Regev, Kiriat Gat, all of (IL)

(73) Assignee: Applied Materials, Inc, Santa Clara, CA (US)

( * ) Notice: Subject to any disclaimer, the term of this patent is extended or adjusted under 35 U.S.C. 154(b) by 0 days.

(21) Appl. No.: 09/079,196

(22) Filed: May 15, 1998

(51) Int. Cl.⁷ .................................................. B25B 11/00
(52) U.S. Cl. ............................................. 269/21; 451/388
(58) Field of Search .................................. 269/21, 289 R; 279/3; 451/388; 431/9, 182

(56) References Cited

U.S. PATENT DOCUMENTS

| | | | |
|---|---|---|---|
| 3,923,251 | * 12/1975 | Flournoy | 239/402.5 |
| 4,684,113 | * 8/1987 | Douglas et al. | 269/21 |
| 5,707,051 | * 1/1998 | Tsuji | 269/21 |
| 5,923,408 | * 7/1999 | Takabayashi | 269/21 |

FOREIGN PATENT DOCUMENTS 63-93536 * 4/1988 (JP) ........................................ 269/21

* cited by examiner

*Primary Examiner*—Joseph J. Hail, III
*Assistant Examiner*—Daniel Shanley
(74) *Attorney, Agent, or Firm*—Thomason, Moser and Patterson

(57) ABSTRACT

A vacuum chuck is disclosed which has nipples as support structure and for vacuum delivery. In the preferred embodiment, two types of nipples are used: "plain" nipples which provide only support and vacuum nipples which provide support and deliver vacuum to retain the wafer on the chuck. The contact surface of the plain nipples is made smaller than that of the vacuum nipples. The chuck is secured to a stage using special supports which have limited flexibility in two axis with respect to the chuck, so as to prevent warping the chuck. Special vacuum nipples are disclosed which do not deliver vacuum unless the wafer exerts sufficient predetermined pressure on the nipple. The chuck is designed to hold both 200 mm and 300 mm wafers.

14 Claims, 4 Drawing Sheets

VACUUM CHUCK HAVING VACUUM-NIPPLES WAFER SUPPORT

BACKGROUND OF THE INVENTION

1. Field of the Invention

The present invention relates to semiconductor manufacturing and, more specifically, to vacuum chucks for handling wafers during semiconductor manufacturing.

2. Description of Related Art

During the semiconductor chip manufacturing, a semiconductor wafer undergoes various processing to create a plurality of chips on the wafer. Additionally, in such various phases of the manufacturing the wafer, undergoes various inspection and quality checks to assure success of the production line. It is known in the art to use vacuum chucks to hold the wafer during the manufacturing, inspection and testing stages.

A conventional vacuum chuck generally comprises a flat plate having a support structure and provisions for delivering vacuum to the back side of the wafer in order to secure the wafer to the support structure. An exemplary conventional chuck 10 is shown in FIG. 1. It comprised substantially of a plate 20, having circular vacuum tunnels 30 having vacuum holes 40 at the bottom thereof. The wafer is placed on the surface of the plate 20, and is secured to the surface by the vacuum delivered to tunnels 30 via holes 40. the chuck is secured to a stage via holders 50. Examples of such chucks can be seen in U.S. Pat. Nos. 5,191,218 and 5,534,073.

The present inventors have identified certain disadvantages in the vacuum chuck of the prior art. First, it has been determined that the chuck can be a source for back-side contamination of the wafer. With the rapid reduction in design rules, the importance of previously irrelevant contaminants has been increasing, including backside contamination of the wafer.

Additionally, due to the cautious acceptance of 300 mm wafer processing by the industry, there may be a need to provide processing equipment capable of processing both 200 mm and 300 mm wafers. Such processing equipment would require chucks capable of handling both 200 mm and 300 mm wafers. Therefore, simply scaling the prior art chuck to accept 300 mm wafers may provide an inadequate solution for the industry.

The introduction of 300 mm wafer also raises the importance of the forces exerted by the chuck on the wafer. Specifically, because of the increased diameter, a warped chuck may cause warpage of the wafer, while a perfectly flat chuck may exert an unwanted pressure on slightly warped wafers.

SUMMARY OF THE INVENTION

Accordingly, the present invention provides a vacuum chuck which avoids the above noted disadvantages of the prior art chuck and, additionally, provides solutions to problems presented or heightened by the introduction of 300 mm wafers.

The basic concept of the invention is to use vacuum nipples for the support and retaining of the wafer on the chuck. The vacuum nipples reduce the contact area of the chuck with the wafer. In its preferred embodiment the novel chuck includes both vacuum nipples and non-vacuum nipples which have smaller contact area than the vacuum nipples.

Two provisions are made in order to avoid warpage: one assists in avoiding warpage of the chuck, while the other assists in preventing the chuck from exerting undesirable pressure on a warped wafer. In order to avoid warpage of the chuck, the chuck is secured to the stage using special supports. This can be done in one or two degrees of freedom, depending on the slots cut. In order to avoid exertion of excessive force on warped wafers the nipples are provided with a mechanism which blocks the vacuum to any particular nipple if the wafer does not rest on that particular nipple.

DETAILED DESCRIPTION OF THE PREFERRED EMBODIMENTS

Figure 1:
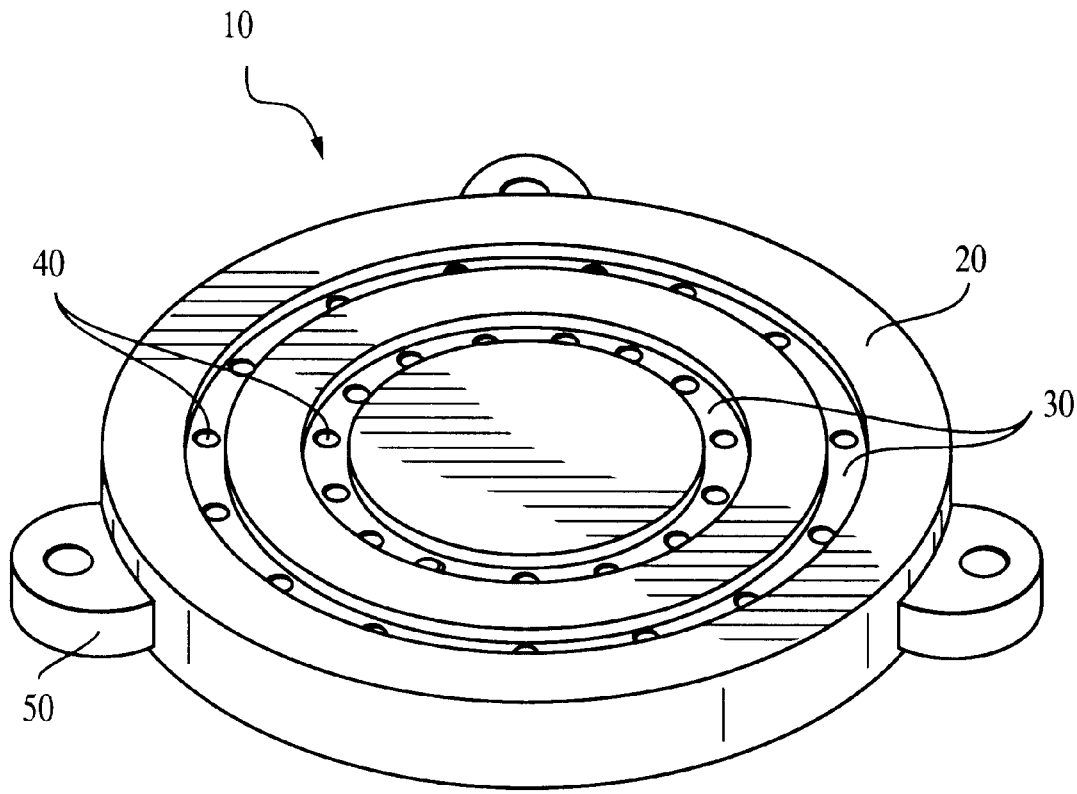
FIG. 1 is an isometric view of a chuck according to the prior art.
Figure 2:
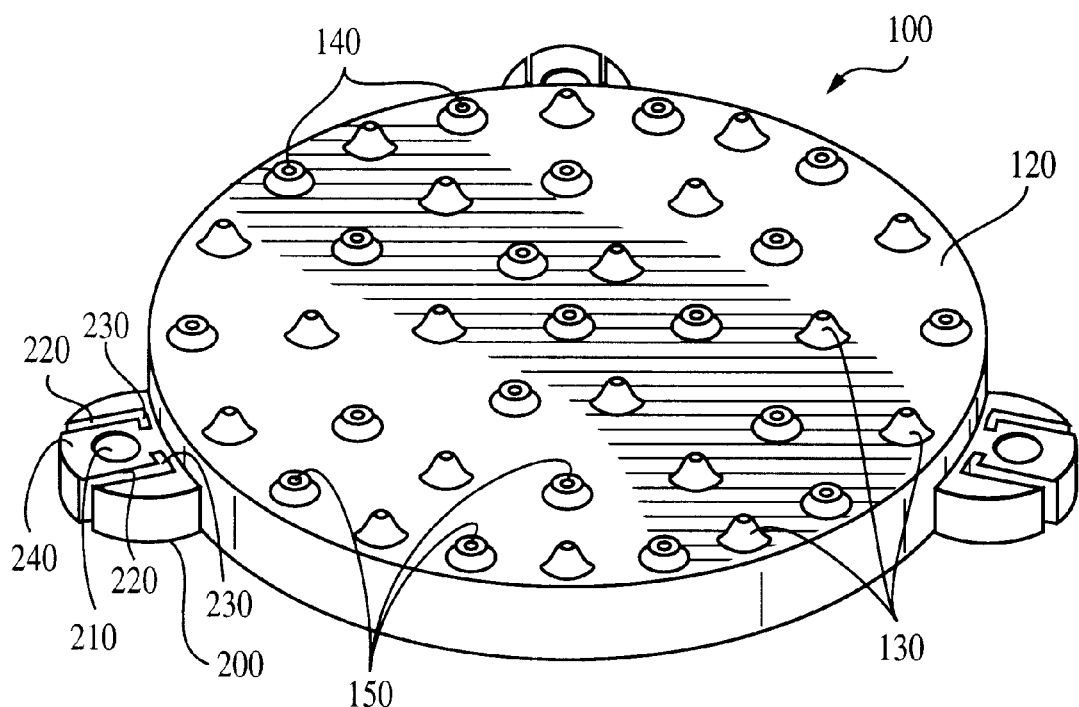
FIG. 2 is an isometric view of a chuck according to the preferred embodiment of the present invention.

A nipple chuck 100 according to a preferred embodiment of the invention is depicted in FIG. 2. The chuck is comprised substantially of a plate 120. The face of the plate 120 is provided with two types of nipples; "plain" nipples (generally indicated at 130) and suction nipples (generally indicated at 140). Both types of nipples provide support for the wafer; however, nipples 140 also secure the wafer to the support by vacuum that is delivered via vacuum holes 150 provided at each vacuum nipple 140.

As can be seen in FIG. 2, according to the preferred embodiment, the nipples 130 and 140 are arranged in concentric circular fashion. This allows use of a single chuck for wafers of various sizes, namely 200 mm and 300 mm wafers. Thus, the chuck of the preferred embodiment can be installed in equipment which is designed to process both wafer sizes.

Figure 3A:
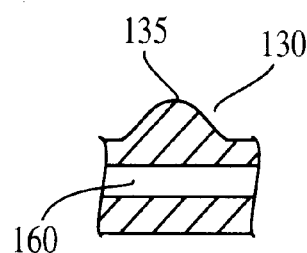
FIG. 3A is a cross-section of a "plain" nipple according to an embodiment of the invention.
Figure 3B:
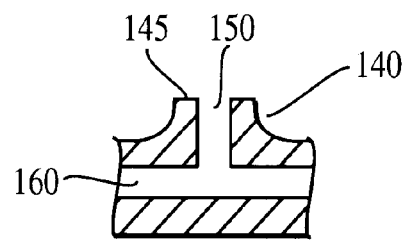
FIG. 3B is a cross-section of a vacuum nipple according to an embodiment of the invention.

FIG. 3A depicts a detailed cross section of the plate at a center of a "plain" nipple 130, while FIG. 3B depicts a detailed cross section of the plate at a center of a suction nipple 140. In both FIGS. 3A and 3B 160 indicates a vacuum passage to the vacuum pump. As can be seen from FIG. 3A, no vacuum passage is provided to the contact surface 135 of nipple 130, while in FIG. 3B a hole 150 provides passage of the vacuum to the contact surface 145 of nipple 140. It can also be gleaned from the Figures that the contact surface 135 of nipple 130 is preferably of smaller diameter than the contact surface 145 of nipple 140.

Returning to FIG. 2, the chuck 100 is attached to the stage via supports 200. Special provisions are made in supports 200 in order to prevent chuck 100 from being warped during installation to the stage, due to different pressure exerted by the bolts attaching the supports 200 to the stage. Specifically, relief cuts 220 are made in support 200 so as to provide section 240 with limited flexibility about one axis with respect to the support 200. The cuts are designed so that sections 240 of all supports 200 have the same moment of inertia. In the preferred embodiment of FIG. 2, additional relief cuts 230 are provided so as to provide a limited flexibility with respect to a second axis.

Figure 4:
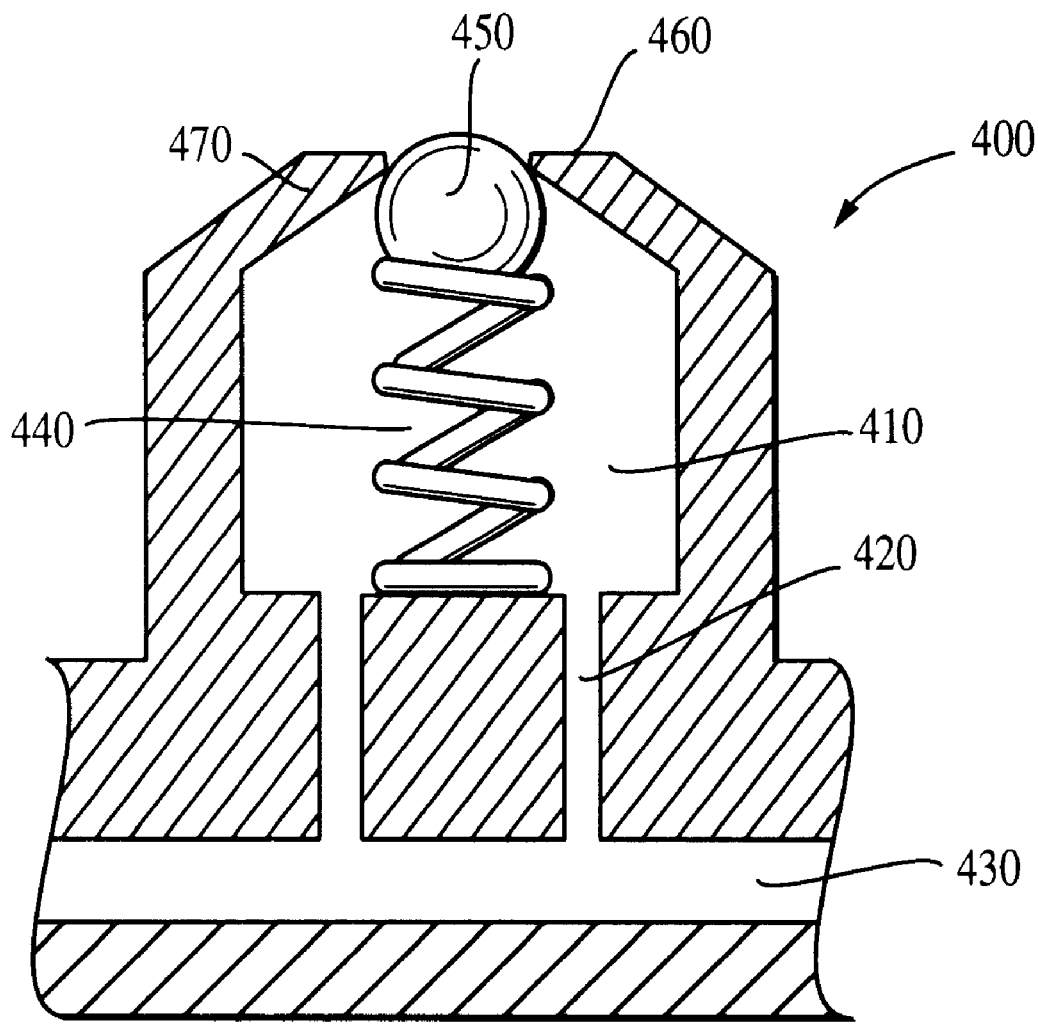
FIG. 4 is a cross-section of a vacuum nipple with vacuum control according to an embodiment of the present invention.

FIG. 4 depicts a cross section of a vacuum nipple 400 which has provisions to control the vacuum. Nipple 400 has a vacuum chamber 410, which is connected to the vacuum passage 430 via holes 420. Element 440 exemplifies a resilient element, such as a spring, which forces ball 450 upwards against restraining ring 470. When no part of the wafer touches ball 450, element 440 forces ball 450 against the ring 470 and no pressure escapes the vacuum chamber. However, if the wafer touches the ball 450 with sufficient force to overcome the resilient element 440, then the ball 450 would be pushed downwards and the wafer would rest on surface 460 of ring 470. This will create a space between the ball 450 and ring 470 so that the vacuum from chamber 410 would pull the wafer against the surface 460 so as to secure the wafer to the chuck.

Vacuum nipple 400 is advantageous for several reasons. First, vacuum nipple 400 can be implemented in the locations that are beyond the perimeter of 200 mm wafers. Thus, when a 200 mm wafer is used, no vacuum will escape from the nipples that are positioned beyond the wafer, while when a 300 mm wafer is used, all the nipples will be engaged and provide vacuum. Second, if a warped wafer is used, no unwanted pressure will be exerted on such a wafer, since any section of the wafer not in contact with ball 450 will not be pulled towards the surface 460.

Figure 5A:
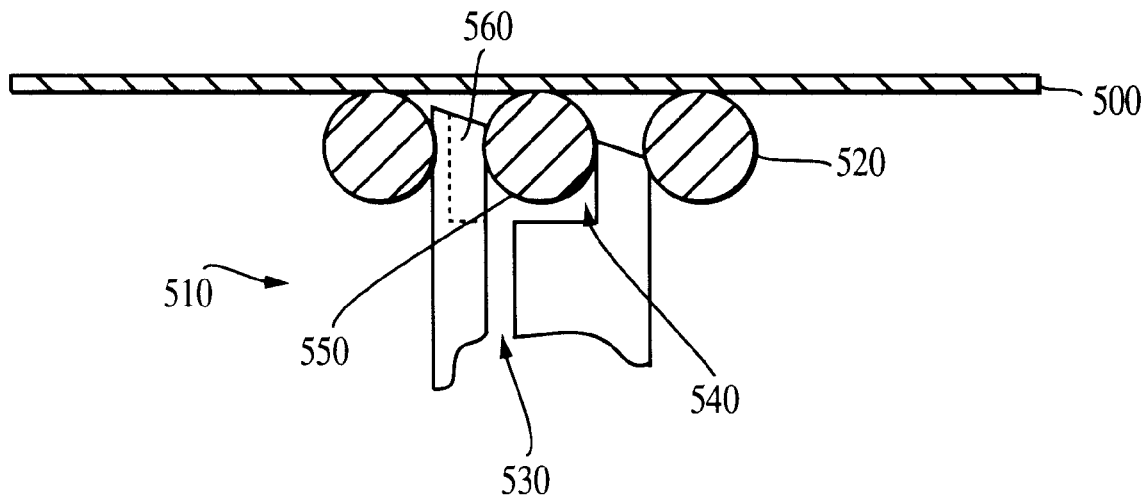
FIGS. 5A and 5B depict another embodiment of vacuum nipple with vacuum control.
Figure 5B:
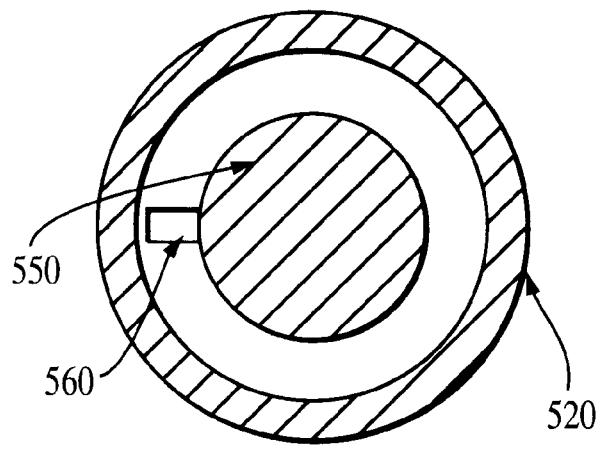

Another embodiment for a vacuum nipple with vacuum control is depicted in FIGS. 5A and 5B. FIG. 5A is a side view showing a part of the wafer 500 resting on a nipple, generally indicated 510. FIG. 5B is a top view with the wafer 500 removed. A flexible ring 520, such as a rubber O-ring, is provided at the top of the nipple and provides some cushioning to the wafer 500. A vacuum passage 530 delivers vacuum to the vacuum chamber 540. Ball 550 is provided at the top of the vacuum chamber, having its uppermost part at about the same level as the O-ring 520. According to this embodiment, the ball 550 is fixed at this elevation; however, a resilient mechanism, such as the one depicted in FIG. 4, can be used in this embodiment as well. A vacuum "tunnel" 560 is provided to deliver vacuum to the wafer for retention.

An advantageous point in the embodiment of FIGS. 5A and 5B is that the resting point of the wafer is only the top portion of the ball 550 and, possibly, the top portion of the O-ring 520.

While the present invention has been described with reference to particular embodiments thereof, it should be appreciated that various modifications can be made without departing from the scope and spirit of the invention as recited in the claims appended hereto.

We claim:

1. A vacuum chuck comprising:
   a plate;
   a plurality of vacuum nipples unitary with one surface of said plate, each of said vacuum nipples having a vacuum hole provided therethrough, the vacuum chuck adapted for connection to a vacuum source; and
   a plurality of plain nipples having no vacuum holes.

2. The vacuum chuck of claim 1, wherein said vacuum nipples are arranged in concentric circles.

3. The vacuum chuck of claim 1 wherein each of said vacuum nipples and plain nipples has a contact surface, and wherein the contact surface of said vacuum nipples has a larger diameter than that of the contact surface of the plain nipples.

4. The vacuum chuck of claim 1, further comprising a plurality of supports to secure said chuck to a carrying element, wherein each of said supports has relief cuts providing limited flexibility in at least one axis with respect to said surface of said plate.

5. The vacuum chuck of claim 4, wherein each of said supports has relief cuts providing limited flexibility in two axes with respect to said surface of said plate.

6. The apparatus of claim 1 wherein each of said plurality of vacuum nipples further comprises a vacuum chamber disposed therewithin and is further provided with vacuum controlling members.

7. The apparatus of claim 6 wherein the vacuum controlling members is a ball disposed within said vacuum chamber.

8. The apparatus of claim 7 wherein the vacuum controlling members further comprise a resilient element bearing upon said ball.

9. An apparatus for supporting and retaining a wafer comprising:
   a plate adapted for connection to a vacuum source;
   a vacuum passage disposed within said plate;
   a plurality of vacuum nipples unitary with said plate communicating with said vacuum passage; and
   a plurality of attaching supports disposed peripherally about the plate, said attaching supports allowing for flexing of said plate about an axis.

10. The apparatus of claim 9 further comprising a plurality of non-vacuum nipples disposed upon said plate.

11. The apparatus of claim 9 wherein the plurality of vacuum nipples are arranged in concentric circles.

12. The apparatus of claim 10 wherein the plurality of non-vacuum nipples are arranged in concentric circles.

13. The apparatus of claim 9 wherein the attaching supports allow for flexing of said plate about a second axis.

14. The apparatus of claim 13 wherein the attaching supports allow for said flexing about said axes via relief cuts provided in said attaching supports.

* * * * *